METHOD FOR DIFFUSING AN IMPURITY FROM A DOPED OXIDE OF PYROLYTIC ORIGIN

Original Filed April 15, 1964

John C. Brixey, Jr.
Kenneth E. Statham
INVENTORS

BY John G. Graham
ATTORNEY 3,354,008

METHOD FOR DIFFUSING AN IMPURITY FROM A DOPED OXIDE OF PYROLYTIC ORIGIN

John C. Brixey, Jr., and Kenneth E. Statham, Richardson, Tex., assignors to Texas Instruments Incorporated, Dallas, Tex., a corporation of Delaware Continuation of application Ser. No. 359,883, Apr. 15, 1964. This application Sept. 21, 1966, Ser. No. 581,118
9 Claims. (Cl. 148—187)

ABSTRACT OF THE DISCLOSURE

Disclosed is a method of doping a semiconductor device by depositing an impurity-containing oxide upon the surface of a semiconductor wafer, and then diffusing the impurity from the oxide into the wafer.

This application is a continuation of application Ser. No. 359,883 filed Apr. 15, 1964, now abandoned.

This invention relates to diffusing of impurities into semiconductor material, and more particularly to a method of diffusing an impurity or impurities into a semiconductor from a doped oxide of pyrolytic origin.

Prior to this invention semiconductors have been treated with impurities under such conditions that the impurity is diffused into the semiconductor, modifying its electrical properties and enhancing its utility to provide such devices as transistors, diodes, resistors and the like. When treated with such an impurity, the impurity forms an atmosphere about the semiconductor body, the atoms of the impurity entering the entire surface of the semiconductor exposed to the impurity containing atmosphere. To obtain selective area diffusion it is necessary to mask areas of the semiconductor device. Masking, however, at diffusion temperatures poses many and varied problems.

To effect a diffusion mask, it has been suggested that the surface of the semiconductor bodies be oxidized. In the case of germanium, the oxide coating is found to be a poor mask because most impurities readily diffuse through a germanium oxide coating. Further, germanium oxide is partially soluble in water, this being an undesirable feature of a mask. On the contrary, a coating of polycrystalline silicon dioxide formed on a semiconductor by oxidation at 1000° C. or above has excellent properties of a diffusion mask. Only gallium penetrates a polycrystalline silicon dioxide coating.

To avoid problems of masking and finding suitable materials for masks, it is possible to use the oxide for the carrier of the impurities, hence, removing the need for a mask since the oxide acts both as a mask and a diffusant carrier. The use of this method not only protects the semiconductor surface against contaminants, but helps prevent the diffusant from alloying with the surface, this sometimes occurring when a diffusant is deposited directly onto the surface and diffused therein.

It is therefore one object of this invention to provide a means for diffusing an impurity into a semiconductor body.

Another object is to provide a means of forming a doped oxide on a semiconductor surface from a pyrolytic origin.

Still another object is to provide a means for selectively diffusing a semiconductor body.

Figures 1, 2A, 2B, 2C, 3A, 3B:
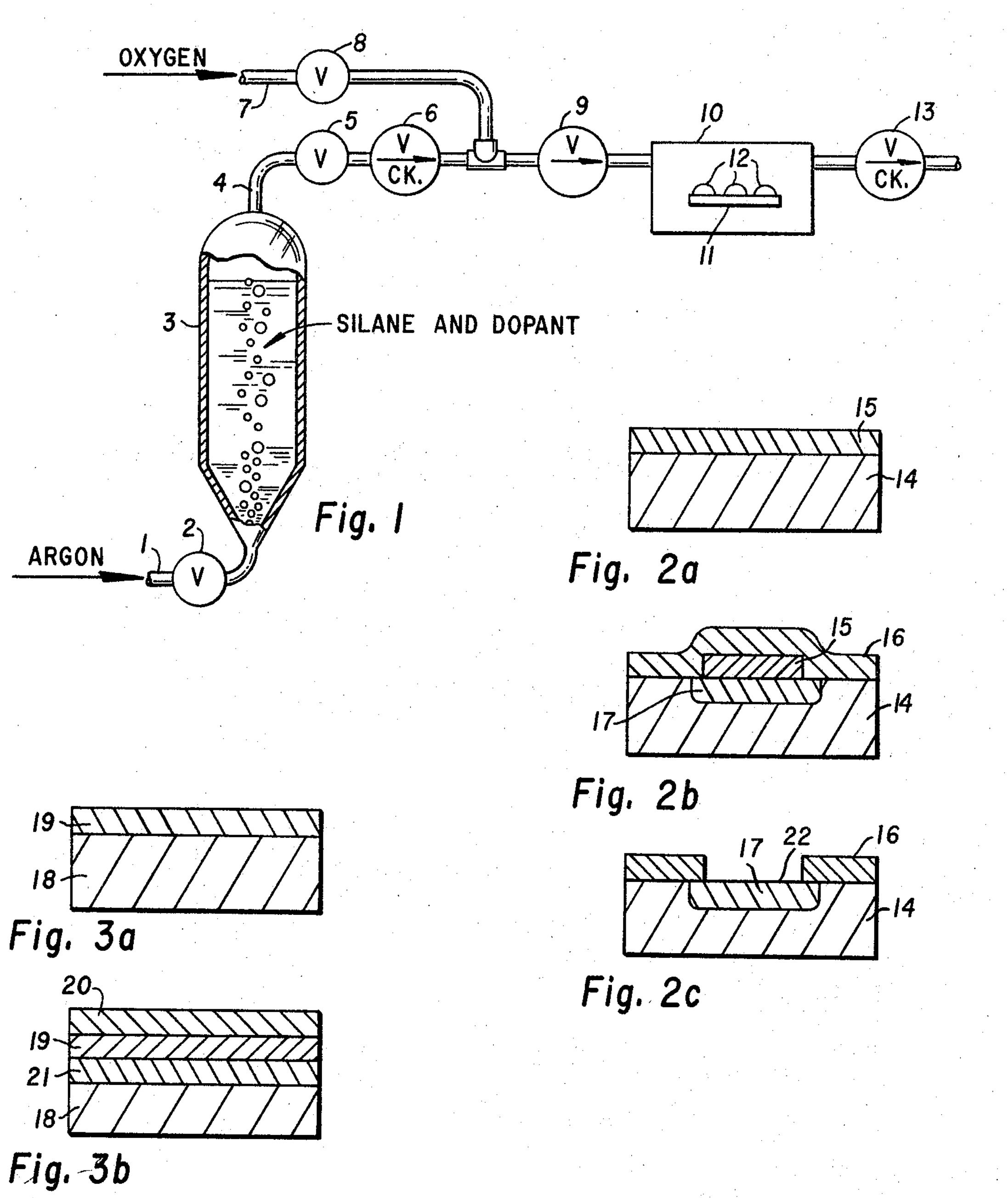
Figure 3C:
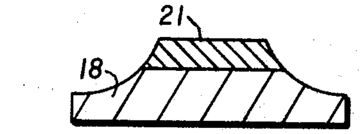

Other objects and features of the invention will become readily apparent when taken in conjunction with the appended claims and attached drawing in which:

FIGURE 1 is a schematic diagram of the apparatus used to form and deposit the doped oxide onto the semiconductor body;

FIGURES 2*a*, 2*b* and 2*c* are cross-sectional views of a semiconductor body showing one possible embodiment made by the practice of the invention; and FIGURES 3*a*, 3*b* and 3*c* show another semiconductor device in cross section illustrating another device made by the practice of the invention.

FIGURE 1 is illustrative of the type of apparatus which may be used in practicing the method of the invention. Line 1 is from a source of argon and supplies argon gas through control valve 2, to vaporizing bottle 3 containing a silane and a suitable dopant. From the bottle 3 the argon-silane-impurity vapor flows through line 4 to valve 5 which controls and regulates the flow of vapor and valve 6 is a check valve allowing no vapor to flow back into bottle 3. Through line 7 flows a high purity commercial oxygen which is combined with the vapor mixture through valve 8. The vapor-oxygen mixture flows through valve 9 into reaction chamber 10, which is closed gas tight except for the exhaust line through non-return valve 13. Within the chamber is a graphite boat 11 upon which semiconductor wafer 12 is mounted.

In practicing the invention a germanium wafer or slice may be placed upon the boat 11 within the chamber 10. Argon and the impurity containing silane is passed through the chamber without the addition of oxygen at ordinary room temperature to sweep the air out of the apparatus. The argon flow rate used is about 1–2 liters per minute. The wafer and chamber are heated to 600° C. until the initial coating of silicon dioxide impurity is deposited on the wafer. The coating should have a minimum thckness of at least 300–400 angstrom units, but because of the possibility of irregularities in a thickness of this silicon dioxide coating, a thickness of 800–2000 angstrom units is preferred. After this first layer of silicon dioxide is formed, oxygen is introduced in the chamber at a flow rate of about one cubic foot per hour along with the silane and the process is continued until a coating of desired thickness of doped silicon dioxide is obtained.

Oxygen gas is not used initially in coating germanium because an oxide of germanium will form at a temperature of 450° C. and above. This oxide is not desired since it performs no useful function and is contaminating. The silanes used contain sufficient oxygen so that polycrystalline silicon dioxide can be formed successfully at the temperature employed.

The silanes employed in the process may be any of the oxy, organic oxy compounds of silicon such as ethylorthosilicate, ethyltrimethoxysilane, tetramethoxysilane, triethoxyethylsilane, triethoxymethylsilane, or ethoxytriethylsilane, which are volatile under the conditions of the process. Any suitable dopant may be used in the silane such as trimethylborate. A mixture of this dopant and one of the silanes would result in a boron doped silicon dioxide surface. After the doped oxide has been deposited upon the surface of the semiconductor wafer, it is then placed in the diffusion chamber and the temperature raised to about 825° C., and held at this temperature until the dopant diffuses to the desired depth.

Although argon has been employed as the carrier gas, other inert gases such as helium, neon, zenon, and krypton may be used. Likewise, even though specific flow rates of the gaseous material used, almost any rate could be used which would allow decomposition of the silane to occur. The reaction temperature is usually between about 600° C. to 620° C., however, silicon dioxide will be deposited on a substrate as low as 575° C. to as high as about 900° C.

By way of an example, FIGURES 2*a*, 2*b* and 2*c* illustrate a device which may be made by practice of the invention.

FIGURE 2*a* shows a semiconductor 14 upon which a doped silicon oxide layer 15 has been deposited upon the wafer. In FIGURE 2*b* a portion of the doped oxide 15 has been removed and another coating of undoped oxide 16 has been grown thereon. After placing the wafer 14 in a diffusion furnace, the diffused region 17 is formed. FIGURE 2*c* shows the wafer after the diffusion has taken place and an opening 22 is cut into the oxide 16 removing a portion thereof and all of the remaining oxide 15, exposing the diffused region in the device. A contact may be made to the diffused region and to one surface of the wafer 14 resulting in a diode device.

Another device that may be made by the practice of the method is illustrated in FIGURES 3*a*, 3*b* and 3*c*. Shown in FIGURE 3*a* is a semiconductor wafer 18 upon which a doped silicon oxide layer 19 has been deposited. FIGURE 3*b* illustrates the same wafer onto which an oxide coating 20 has been deposited which is not impurity containing. After this non-impurity containing oxide coating is placed on the wafer, the wafer may be placed into a diffusion furnace to form the diffusion region 21. A portion of the wafer may be etched away leaving the mesa-type structure shown in FIGURE 3*c*. The mesa-top portion 23 is the part of region 21 remaining after the etching step is performed and is formed by the diffusion from the oxide impurity coating 19. The device shown in FIGURE 3*c* may be used as a diode or a subsequent diffusion may be made, making another diffusion into the region 23 (not shown), thus forming a third region.

The temperatures and materials given have been disclosed for purposes of illustration and should not be construed as placing undue limitations upon the invention, as many variations will be obvious without departing from the scope of the appended claims. Specific examples have been given showing structures which may be made by the practice of the invention, but should not be construed in any limiting sense to be the only structures that may be formed by the practice of the invention.

What is claimed is:

1. A method of selectively diffusing an impurity into a semiconductor device comprising the steps of:
depositing an impurity containing oxide upon the surface of said semiconductor device, selectively removing a portion of said oxide to leave the desired configuration and diffusing the impurity into the device from the remaining oxide.

2. The method of doping a semiconductor device comprising the steps of:
exposing a semiconductor to an atmosphere of impurity containing silicon and argon in a reaction chamber, forming a coating of silicon dioxide on the surface of said semiconductor device, said silicon dioxide containing said impurity and diffusing said impurity out of said oxide into said semiconductor device.

3. The method according to to claim 2 wherein the temperature within said reaction chamber is about 575° C. to 900° C.

4. The method according to claim 2 wherein the temperature of said diffusion is about 700° C. to 900° C.

5. A method of making a semiconductor device comprising the steps of:
forming upon one face of a semiconductor substrate a first insulating layer containing a doping impurity, selectively removing a portion of said first insulating layer, with the remainder of said first insulating layer overlying a region in said substrate, forming an undoped second insulating layer on said remaining portion of said first insulating layer and the face of said substrate exposed by the removal of said portion of said first insulating layer, and heating said substrate to a temperature sufficient to diffuse said doping impurity from said first insulating layer into said region in said substrate to form a PN junction.

6. A method of making a semiconductor device comprising the steps of:
passing argon through a vaporizing container containing silane and a doping impurity to form a first mixture, combining said first mixture with oxygen to form a second mixture, flowing said second mixture over the heated surface of a semiconductor substrate within a reaction chamber to form on one face of a semiconductor substrate a first insulating layer containing said doping impurity, selectively removing a portion of said first insulating layer with the remainder of said first insulating layer overlying a region in said substrate, forming an undoped second insulating layer on said remainder of said first insulating layer and said face of said substrate exposed by the removal of said portion of said first insulating layer, and heating said substrate thus formed to a temperature sufficient to diffuse said doping impurity from said first insulating layer into said region in said substrate, thereby forming a PN junction.

7. A method of making a semiconductor device comprising the steps of:
passing argon through a vaporizing bottle containing a silane and a dopant to form a first mixture, combining said first mixture with oxygen to form a second mixture, flowing said second mixture over the surface of a semiconductor substrate within a reaction chamber thereby forming upon one face of a semiconductor substrate a first silicon oxide layer containing a doping impurity, selectively removing a portion of said first silicon oxide layer with the remainder of said first silicon oxide layer overlying a region in said substrate, forming an undoped second silicon oxide layer on said remainder of said first silicon oxide layer and said face of said substrate exposed by the removal of said portion of said first silicon oxide layer, heating said substrate to a temperature sufficient to diffuse said doping impurity from said silicon oxide layer into said region in said substrate thereby forming a PN junction, removing said remainder of said first silicon oxide layer and the portion of said second silicon oxide layer on said first silicon oxide layer, thereby exposing a portion of the surface of said diffused region, and forming metallic contacts to said exposed portion of said diffused region and to the opposite face of said substrate.

8. A method of making a semiconductor device as in claim 7 wherein said doping impurity is boron and said substrate is heated to a temperature of about 825° C. to diffuse said boron impurity from said silicon oxide layer into said region in said substrate.

9. A method of doping a semiconductor device comprising the steps of pyrolyticly depositing an impurity-containing coating of silicon dioxide upon the surface of a semiconductor wafer, and diffusing said impurity from said oxide into said wafer.

References Cited

UNITED STATES PATENTS

| | | | |
|---|---|---|---|
| 2,974,073 | 3/1961 | Armstrong | 148—189 |
| 2,804,405 | 8/1957 | Derick | 148—189 |
| 2,873,222 | 2/1959 | Derick | 148—187 X |
| 3,055,776 | 9/1962 | Stevenson. | |
| 3,064,167 | 11/1962 | Hoerni | 148—187 X |
| 3,084,079 | 4/1963 | Harrington. | |
| 3,085,033 | 4/1963 | Handleman | 148—191 |
| 3,200,019 | 8/1965 | Scott. | |
| 3,203,840 | 8/1965 | Harris | 148—187 |

HYLAND BIZOT, *Primary Examiner.*